United States Patent [19]

Herbst et al.

[11] 4,432,074

[45] Feb. 14, 1984

[54] PROCESS FOR THE OPERATION OF A CID ARRANGEMENT

[75] Inventors: Heiner Herbst, Haar; Rudolf Koch, Munich, both of Fed. Rep. of Germany

[73] Assignee: Siemens Aktiengesellschaft, Berlin & Munich, Fed. Rep. of Germany

[21] Appl. No.: 956,604

[22] Filed: Nov. 1, 1978

Related U.S. Application Data

[63] Continuation of Ser. No. 834,426, Sep. 19, 1977.

[30] Foreign Application Priority Data

Sep. 20, 1976 [DE] Fed. Rep. of Germany ....... 2642145

[51] Int. Cl.³ .................. G11C 11/34; H01L 29/78
[52] U.S. Cl. ................................ 365/183; 357/23; 357/24

[58] Field of Search .............. 357/24; 307/238; 365/183

[56] References Cited

U.S. PATENT DOCUMENTS

| | | | |
|---|---|---|---|
| 3,801,883 | 4/1974 | Tiemann | 357/24 |
| 3,852,801 | 12/1974 | Itoh et al. | 357/24 |
| 3,882,531 | 5/1975 | Michon et al. | 357/24 |
| 3,997,799 | 12/1976 | Baker | 357/24 |

*Primary Examiner*—Gene M. Munson
*Attorney, Agent, or Firm*—Hill, Van Santen, Steadman & Simpson

[57] ABSTRACT

A method for the operation of a CID (Charge Injection Device) arrangement is disclosed. Electric analog signals are input into the CID arrangement by use of first and second capacitors connected to row and column lines. A signal voltage creates a signal charge in the first capacitor which is read into the second capacitor.

6 Claims, 2 Drawing Figures

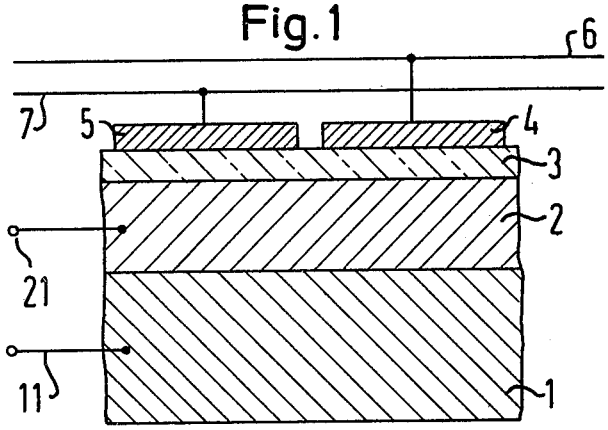
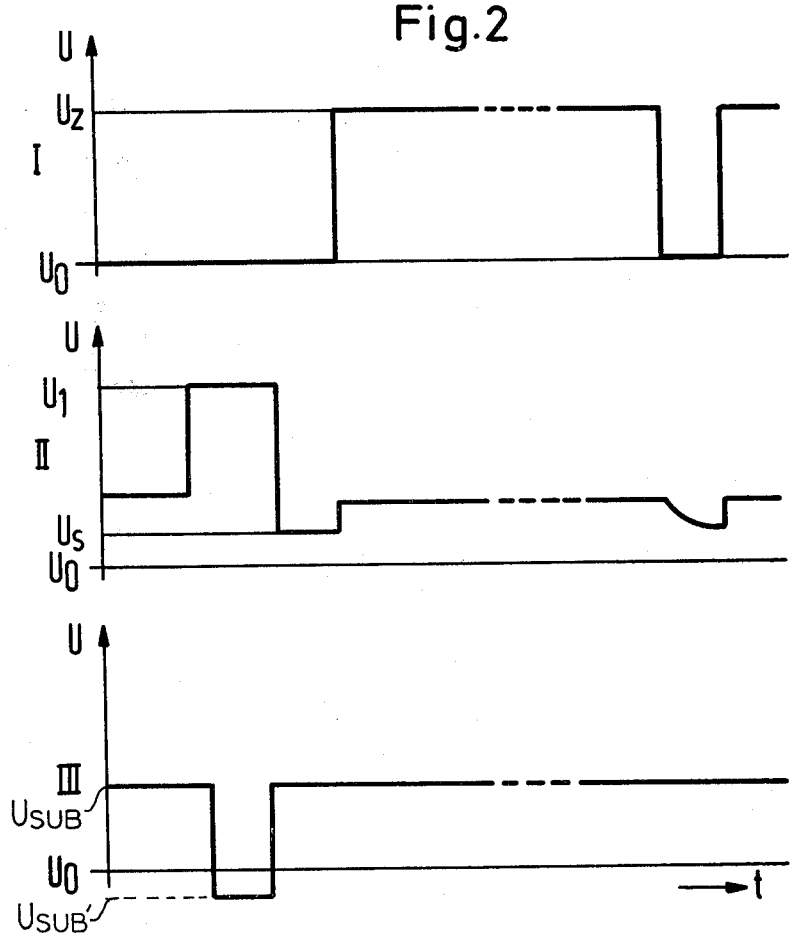

PROCESS FOR THE OPERATION OF A CID ARRANGEMENT

This application is a continuation of application Ser. No. 834,426, filed Sept. 19, 1977.

BACKGROUND OF THE INVENTION

The present invention relates to a process for the operation of a CID arrangement. On a surface of a substrate which consists of a doped semiconductor material of one conductivity type provided with a substrate terminal there is arranged a doped layer of the opposite conductivity type which possesses a terminal contact. On this layer there are arranged one or more first and second insulating layer capacitors which are arranged in matrix form in rows and columns. The gate electrodes of the first capacitors are each connected column-wise to a column line. The one or more second insulating layer capacitors are arranged on the doped layer directly beside each first insulating layer capacitor, the gate electrodes of these second insulating layer capacitors each being connected row-wise to a row line.

CID arrangements of the type referred to above are known. Arrangements of this type are employed as opto-electronic sensors.

SUMMARY OF THE INVENTION

An object of the present invention is to provide a process with which electrical analogue signals can be input into the CID (Charge Injection Device) arrangement of the type mentioned in the introduction.

This object is realized in that a reference voltage is connected to the terminal of the doped layer. By the connection of an appropriate voltage (relative to the reference voltage) to at least one column line or row line, beneath the gate electrodes of the capacitors connected thereto depletion boundary layers are produced in the doped layer. The voltage across the column line or row line is selected to be such that the depletion boundary layers extend to the substrate and/or the substrate terminal is poled in the forwards direction relative to the reference voltage for a predetermined length of time. Thereafter the voltage across the column line or row line is maintained or is reduced by a signal voltage, and thereafter, by the connection of an appropriate voltage to at least one row line or column line which is greater than the voltage currently prevailing on the column line or row line, depletion boundary layers are produced in the doped layer beneath the gate electrodes of the insulating capacitors connected thereto.

In an advantageous further development of the process, simultaneously to the connection of the voltage to the row line (column line), the voltage across the column line (row line) is increased while maintaining the same polarity.

The fundamental advantages of the process are as follows. The process enables a CID arrangement of the type referred to in the introduction to be used as an analog store, in particular as an image store. As nondestruct read-out processes are known in relation to CID arrangements of the type mentioned in the introduction (see H. K. Burke, G. J. Michon, Charge Injection Imaging: Operating Techniques and Performance Characteristics in IEEE J. Solid States Circuits, Vol. SC-11 No. 1, February 1976) an analog store of this type can be read out non-destructively. The process permits a random access to the individual storage elements, each storage element consisting of a first insulating layer capacitor and a directly adjoining second insulating layer capacitor.

BRIEF DESCRIPTION OF THE DRAWINGS

FIG. 1 is a cross-sectional view through a storage element of a known CID arrangement.

FIG. 2 shows, in diagrams I to III, operating voltages plotted over the time t in a CID arrangement operated according to the invention.

DESCRIPTION OF THE PREFERRED EMBODIMENTS

In FIG. 1 the substrate, for example n-doped silicon having a doping density of $10^{18}$ cm$^{-3}$, is referenced 1. A layer 2 is doped oppositely to the substrate and consists, for example, of a p-doped epitaxial layer composed of silicon having a doping density of $10^{15}$ cm$^{-3}$ and a layer thickness of 3 $\mu$m. On this layer 2 is arranged an electrically insulating layer 3 consisting, for example, of silicon dioxide. This layer 3 bears a gate electrode 4, which, together with the electrically insulating layer 3 and the layer 2, forms a first insulating layer capacitor. Directly beside this gate electrode a second gate electrode 5 is arranged upon the electrically insulating layer and, together with the electrically insulating layer 3 and the layer 2 forms a second insulating layer capacitor. The gate electrode 4 is connected to a column line 6 and the gate electrode 5 is connected to a row line 7. The terminal of the doped layer is referenced 21 and the substrate terminal is referenced 11.

A device as represented in FIG. 1 is now operated as follows. A substrate voltage $U_{SUB}$ above a reference voltage $U_O$ is connected to the terminal 11. The electrode 4 is connected to a voltage, $U_1$ relative to the substrate voltage, which produces a depletion boundary layer beneath in the doped layer 2. Here it is expedient to fill the relevant insulating layer capacitor with minority charge carriers relative to the layer. This can be carried out in such manner that the voltage $U_1$ is selected to be of such magnitude that the depletion boundary layer extends to the substrate 1 (breakthrough), or the substrate terminal 11, which is normally connected to a blocking voltage, is poled in the forwards direction (a substrate voltage $U_{SUB}'$ below $U_O$). Both possibilities can also be applied simultaneously. The substrate terminal 11 is then poled again in the blocking direction. Now the analog signal $U_S$ which is to be written-in is connected to the electrode 4 via the row line 6. Here only voltages which do not exceed $U_1$ are permissible. The quantity of charge stored beneath the electrode 4 corresponds to the value $U_S$. Now the electrode 5 is connected via the row line 7 to a voltage $U_Z$ which should be selected to be greater than the voltage $U_S$. Here it is expedient for this voltage to also exceed $U_1$. The quantity of charge beneath the electrode 4 now flows beneath the electrode 5 where it is stored. It is expedient for the voltage across the electrode 4 to be simultaneously increased somewhat. To enable the stored information to be read-out, the row line 7 is connected to the voltage $U_O$, as a result of which the stored quantity of charge is returned to beneath the electrode 4 and, across the column line 6, which for this purpose must be electrically floating, produces a voltage change which can be processed as a read-out signal. Then the quantity of charge stored beneath the electrode 4 can be returned to beneath the electrode 5 since the voltage $U_Z$ is re-connected to the row line 7. In the diagrams I to III of FIG. 2, the voltages across the electrodes and the substrate terminal are plotted over the time t. Diagram I indicates the time curve of the voltage across the electrode 5, diagram II illustrates the time curve of the voltage across the electrode 4 and diagram III illustrates the time curve of the voltage across the substrate terminal 11. All the voltages are referenced to the reference potential $U_O$ across the terminal 21. The ordinate arrows point in the direction of positive voltage values. A p-doped layer 2 has been taken as a basis. In the case of a n-doped layer 2, the polarity of the voltages should be reversed.

Although various minor modifications may be suggested by those versed in the art, it should be understood that we wish to embody within the scope of the patent warranted hereon, all such embodiments as reasonably and properly come within the scope of our contribution to the art.

We claim as our invention:

1. A method for the operation of a CID (Charge Injection Device) arrangement for storing and non-destructive read-out of analog signals, comprising the steps of:

providing a substrate which comprises doped semiconductor material of one conductivity type with a substrate terminal, a doped layer of the opposite conductivity type arranged on a surface of the substrate, said doped layer having a terminal contact, at least first and second insulating layer capacitors on the doped layer arranged in matrix form in rows and columns, said substrate extending below all of the first and second insulating layer capacitors, a gate electrode of the first capacitor being connected column-wise to a column line, said at least one second insulating layer capacitor being arranged directly beside the first insulating layer capacitor, the gate electrode of said second insulating layer capacitor being connected row-wise to a row line;

connecting a substrate voltage above a reference voltage to the substrate terminal of the substrate;

connecting a first voltage relative to the substrate voltage to at least one column line, a depletion boundary layer being produced in the doped layer beneath the gate electrode of the first capacitor connected thereto, said first voltage on the column line being selected to be such that the depletion boundary layer extends to the substrate;

placing an analog signal voltage to be read in on the column line and which is no higher than was the first voltage;

connecting a second voltage which is greater than the analog signal voltage currently prevailing on the column line to the row line, a depletion boundary layer being produced in the doped layer beneath the gate electrode of the second insulating capacitor and above the substrate so that a signal charge stored beneath the first capacitor gate electrode flows beneath the second capacitor gate electrode; and reading out the stored signal charge beneath the second capacitor gate electrode to beneath the first capacitor gate electrode by connecting the row line to the reference voltage and electrically disconnecting the first capacitor gate electrode from any predetermined potential, a read-out analog signal being non-destructively produced on the column line and the disconnected first capacitor gate electrode.

2. The method as claimed in claim 1, characterized in that simultaneously to the connection of the second voltage to the row line, the signal voltage on the column line is increased.

3. The method as in claim 1 in which during the application of the first voltage on the column line the substrate voltage on the substrate is lowered to bias a substrate and doped layer junction in the forward direction for a predetermined length of time prior to application of the signal voltage on the column line.

4. The method of claim 1 including the further step of returning after read-out the quantity of signal charge stored beneath the first capacitor gate electrode to beneath the second capacitor gate electrode by reconnecting the second voltage to the row line.

5. The method of claim 1 in which the matrix is formed by a plurality of first and second capacitors.

6. A method for the operation of a CID (Charge Injection Device) arrangement for storing and non-destructive read-out of analog signals, comprising the steps of:

providing a substrate which comprises doped semiconductor material of one conductivity type with a substrate terminal, a doped layer of the opposite conductivity type arranged on a surface of the substrate, said doped layer having a terminal contact, at least first and second insulating layer capacitors on the doped layer arranged in matrix form in rows and columns, said substrate extending below all of the first and second insulating layer capacitors, a gate electrode of the first capacitor being connected row-wise to a row line, said at least one second insulating layer capacitor being arranged directly beside the first insulating layer capacitor, the gate electrode of said second insulating layer capacitor being connected column-wise to a column line;

connecting a substrate voltage above a reference voltage to the substrate terminal of the substrate;

connecting a first voltage relative to the substrate voltage to at least one row line, a depletion boundary layer being produced in the doped layer beneath the gate electrode of the first capacitor connected thereto, said first voltage on the row line being selected to be such that the depletion boundary layer extends to the substrate;

placing an analog signal voltage to be read in on the row line which is no higher than was the first voltage;

connecting a second voltage which is greater than the analog signal voltage currently prevailing on the row line, to the column line, a depletion boundary layer being produced in the doped layer beneath the gate electrode of the second insulating capacitor and above the substrate so that a signal charge stored beneath the first capacitor gate electrode flows beneath the second capacitor gate electrode; and reading out the stored signal charge beneath the second capacitor gate electrode to beneath the first capacitor gate electrode by connecting the column line to the reference voltage and electrically disconnecting the first capacitor gate electrode from any predetermined potential, a read-out analog signal being non-destructively produced on the row line and the disconnected first capacitor gate electrode.

* * * * *